United States Patent
Li et al.

(10) Patent No.: US 9,530,345 B2
(45) Date of Patent: Dec. 27, 2016

(54) GATE DRIVE ON ARRAY UNIT AND METHOD FOR DRIVING THE SAME, GATE DRIVE ON ARRAY CIRCUIT AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fuqiang Li, Beijing (CN); Like Hu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/890,345

(22) PCT Filed: Apr. 10, 2015

(86) PCT No.: PCT/CN2015/076285
§ 371 (c)(1),
(2) Date: Nov. 10, 2015

(87) PCT Pub. No.: WO2016/065850
PCT Pub. Date: May 6, 2016

(65) Prior Publication Data
US 2016/0293092 A1    Oct. 6, 2016

(30) Foreign Application Priority Data
Oct. 31, 2014  (CN) .......................... 2014 1 0602347

(51) Int. Cl.
G09G 3/36   (2006.01)
G09G 3/20   (2006.01)
G11C 19/28  (2006.01)

(52) U.S. Cl.
CPC ............. *G09G 3/2092* (2013.01); *G11C 19/28* (2013.01); *G09G 2310/08* (2013.01)

(58) Field of Classification Search
CPC ..................... G09G 3/3677; G09G 2310/0286; G09G 3/3648; G09G 2300/0408; G09G 2310/0289; G09G 3/3611; G09G 3/3291; G09G 2310/06; G09G 3/3674
(Continued)

(56) References Cited

U.S. PATENT DOCUMENTS 8,019,039 B1 * 9/2011 Tsai ..................... G11C 19/184
377/64
2004/0189585 A1 * 9/2004 Moon ..................... G11C 19/28
345/100

(Continued)

FOREIGN PATENT DOCUMENTS

CN    101582232 A    11/2009
CN    102682699 A    9/2012
(Continued)

OTHER PUBLICATIONS

International Search Report and Written Opinion both dated Jul. 14, 2015; PCT/CN2015/076285.

*Primary Examiner* — Duc Dinh
(74) *Attorney, Agent, or Firm* — Ladas & Parry LLP

(57) ABSTRACT

Provided are a GOA unit and driving method, a GOA circuit and a display apparatus. A first node control unit (31) pulls a first node (PU) to a voltage at a first level terminal (CN) under the control of a first input terminal (IN), or to a voltage at a second level terminal (CNB) under the control of a second input terminal (INPUT). A second node control unit
(Continued)

(32) pulls a second node (PD) to a voltage at a third level terminal (VGH) under the control of the first level terminal (CN), the second level terminal (CNB), a second clock signal terminal (CK2) and a third clock signal terminal (CK3), or to a voltage at a fourth level terminal (VGL) under the control of the first node (PU). An output unit (33) outputs a signal at the first clock signal terminal (CK1) under the control of the first node (PU), or pulls the output terminal (OUTPUT) to the voltage at the fourth level terminal (VGL) under the control of the second node (PD).

15 Claims, 10 Drawing Sheets

(58) Field of Classification Search
USPC .................................. 345/87, 89, 98, 99, 100
See application file for complete search history.

(56) References Cited

U.S. PATENT DOCUMENTS

| | | | |
|---|---|---|---|
| 2008/0088555 A1* | 4/2008 | Shin | G09G 3/3677 |
| | | | 345/87 |
| 2009/0256794 A1* | 10/2009 | Jang | G11C 19/28 |
| | | | 345/100 |
| 2011/0150169 A1 | 6/2011 | Lin et al. | |

FOREIGN PATENT DOCUMENTS

| | | |
|---|---|---|
| CN | 103208251 A | 7/2013 |
| CN | 104021750 A | 9/2014 |
| CN | 104318886 A | 1/2015 |

\* cited by examiner

GATE DRIVE ON ARRAY UNIT AND METHOD FOR DRIVING THE SAME, GATE DRIVE ON ARRAY CIRCUIT AND DISPLAY APPARATUS

TECHNICAL FIELD OF THE DISCLOSURE

The present disclosure relates to a field of display manufacturing, and particularly to a Gate Drive on Array (GOA) unit and a method for driving the same, a Gate Drive on Array circuit and a display apparatus.

BACKGROUND

In recent years, development of display has shown a trend of high integration and low cost. One extremely important technology is applying the GOA technology into mass production. The GOA technology is adopted to integrate a gate switching circuit on an array substrate of a display panel so as to omit a gate drive integrated circuit part, such that production cost can be reduced in terms of both material cost and manufacturing process. The gate switching circuit integrated on the array substrate by the GOA technology is referred to as a GOA circuit or a shift register circuit.

The GOA circuit comprises a plurality of GOA units, each of which comprises several thin film transistors (TFTs). Each of the GOA units corresponds to a gate line, and particularly each of the GOA units has an output terminal connected to its corresponding gate line. Since the GOA circuit has to be implemented by a large scale integrated circuit IC, how to control the scale of the IC while ensuring the performance of the GOA circuit has became a development trend of the GOA circuit.

SUMMARY

According to embodiments of the present disclosure, there are provided a GOA unit and a method for driving the same, a GOA circuit and a display apparatus capable of reducing scale of IC while ensuring performance of the GOA circuit so as to reduce production cost.

According to a first aspect of the present disclosure, there is provided a GOA unit comprising a first node control unit, a second node control unit and an output unit. The first node control unit is connected to a first input terminal, a second input terminal, a first level terminal, a second level terminal, a first node, a second node and a fourth level terminal, and is configured to pull a voltage at the first node to a voltage at the first level terminal under the control of a signal at the first input terminal, or pull the voltage at the first node to a voltage at the second level terminal under the control of a signal at the second input terminal. The second node control unit is connected to the first level terminal, the second level terminal, a third level terminal, the fourth level terminal, a second clock signal terminal, a third clock signal terminal, the first node and the second node, and is configured to pull a voltage at the second node to a voltage at the third level terminal under the control of the first level terminal, the second level terminal, the second clock signal terminal and the third clock signal terminal, or pull the voltage at the second node to a voltage at the fourth level terminal under the control of the first node. The output unit is connected to an output terminal, a first clock signal terminal, the first node, the second node and the fourth level terminal, and is configured to output the signal at the first clock signal terminal at the output terminal under the control of the first node, or pull the voltage at the output terminal to the voltage at the fourth level terminal under the control of the second node.

Optionally, the first node control unit comprises a first transistor having a gate connected to the first input terminal, a source connected to the first level terminal and a drain connected to the first node and configured to pull the voltage at the first node to the voltage at the first level terminal under the control of the signal at the first input terminal; and a second transistor having a gate connected to the second input terminal, a source connected to the second level terminal and a drain connected to the first node, and configured to pull the voltage at the first node to the voltage at the second level terminal under the control of the signal at the second input terminal.

Optionally, the first node control unit is further configured to pull the voltage at the first node to the voltage at the fourth level terminal under the control of the second node, and further comprises a sixth transistor having a gate connected to the second node, a source connected to the first node and a drain connected to the fourth level terminal and configured to pull the voltage at the first node to the voltage at the fourth level terminal under the control of the second node.

Optionally, the output unit comprises a third transistor having a gate connected to the first node, a source connected to the first clock signal terminal and a drain connected to the output terminal and configured to output the signal at the first clock signal terminal at the output terminal under the control of the first node; a fourth transistor having a gate connected to the second node, a source connected to the output terminal and a drain connected to the fourth level terminal and configured to pull the voltage at the output terminal to the voltage at the fourth level terminal under the control of the signal of the second node.

Optionally, the output unit further comprises a second capacitor having a first electrode connected to the first node and a second electrode connected to the output terminal, and configured to store the voltage at the first node.

Optionally, the second node control unit comprises a fifth transistor having a gate connected to the first node, a source connected to the second node and a drain connected to the fourth level terminal, and configured to pull the voltage at the second node to the fourth level terminal under the control of the signal at the first node; a seventh transistor having a gate connected to the second clock signal terminal, a source connected to the first level terminal; an eighth transistor having a gate connected to the third clock signal terminal, a drain connected to the second level terminal and a source connected to a drain of the seventh transistor; and a ninth transistor having a gate connected to the drain of the seventh transistor, a source connected to the third level terminal and a drain connected to the second node.

Optionally, the second node control unit comprises a fifth transistor having a gate connected to the first node, a source connected to the second node and a drain connected to the fourth level terminal, and configured to pull the voltage at the second node to the voltage at the fourth level terminal under the control of the signal at the first node; a seventh transistor having a gate connected to the first level terminal, a source connected to the second clock signal terminal; an eighth transistor having a gate connected to the second level terminal, a drain connected to the third clock signal terminal and a source connected to the drain of the seventh transistor; and a ninth transistor having a gate connected to the drain of the seventh transistor, a source connected to the third level terminal and a drain connected to the second node.

Optionally, the second node control unit further comprises a first capacitor having a first electrode connected to the second node and a second electrode connected to the fourth level terminal, and configured to hold the voltage at the second node.

According to a second aspect of the present disclosure, there is provided a method for driving the GOA unit. The method comprises: during a first phase, the first node control unit pulls the voltage at the first node to the voltage at the first level terminal under the control of the signal at the first input terminal, and the second node control unit pulls the voltage at the second node to the voltage at the fourth level terminal under the control of the signal at the first node; during a second phase, the output unit outputs the signal at the first clock signal terminal at the output terminal under the control of the first node, and the second node control unit pulls the voltage at the second node to the voltage at the fourth level terminal under the control of the signal at the first node; during a third phase, the second node control unit pulls the voltage at the second node to the voltage at the third level terminal under the control of the first level terminal, the second level terminal, the second clock signal terminal and the third clock signal terminal, the first node control unit pulls the voltage at the first node to the voltage at the second level terminal under the control of the signal at the second input terminal, and the output unit pulls the voltage at the output terminal to the voltage at the fourth level terminal under the control of the second node.

Optionally, in the method for driving the GOA unit, during the third phase, the first node control unit further pulls the voltage at the first node to the voltage at the fourth level terminal under the control of the signal at the second node.

According to a third aspect of the present disclosure, there is provided a method for driving the GOA unit. The method comprises: during a first phase, the first node control unit pulls the voltage at the first node to the voltage at the second level terminal under the control of the signal at the second input terminal, and the second node control unit pulls the voltage at the second node to the voltage at the fourth level terminal under the control of the signal at the first node; during a second phase, the output unit outputs the signal at the first clock signal terminal at the output terminal under the control of the first node, and the second node control unit pulls the voltage at the second node to the voltage at the fourth level terminal under the control of the signal at the first node; during a third phase, the second node control unit pulls the voltage at the second node to the voltage at the third level terminal under the control of the first level terminal, the second level terminal, the second clock signal terminal and the third clock signal terminal, the first node control unit pulls the voltage at the first node to the voltage at the first level terminal under the control of the signal at the first input terminal, and the output unit pulls the voltage at the output terminal to the voltage at the fourth level terminal under the control of the second node.

Optionally, in the method for driving the GOA unit, during the third phase, the first node control unit further pulls the voltage at the first node to the voltage at the fourth level terminal under the control of the signal at the second node.

According to a fourth aspect of the present disclosure, there is provided a GOA circuit comprising at least three stages of GOA units according to any of the above discussed GOA units connected in cascade. Except a first stage of GOA unit and a last stage of GOA unit, the output terminal of each stage of GOA unit is connected to the second input terminal of its previous stage of GOA unit and the first input terminal of its next stage of GOA unit. The output terminal of the first stage of GOA unit is connected to the first input terminal of its next stage of GOA unit, and the output terminal of the last stage of GOA unit is connected to the second input terminal of its previous stage of GOA unit. A frame start signal is input to the first input terminal of the first stage of GOA unit, or is input to the first input terminal of the last stage of GOA unit.

According to a fifth aspect of the present disclosure, there is provided a display apparatus comprising the above discussed GOA unit.

In the above solutions, control on the voltage at the first node is implemented by the first node control unit, control on the voltage at the second node is implemented by the second node control unit, and a gate driving signal is outputted at the output terminal of the output unit under the control of the first node and the second node, so as to reduce the scale of the IC while ensuring the performance of the GOA unit, and thus reduce production cost.

BRIEF DESCRIPTION OF THE DRAWINGS

In order to explain the technical solutions in the embodiments of the present disclosure or in the prior art more clearly, accompanying drawings required for describing the embodiments of the present disclosure or the prior art will be introduced. Obviously, the accompanying drawings below are only some embodiments of the present disclosure, and based on the accompanying drawings, other accompanying drawings can be obtained by those skilled in the art without paying inventive labor.

DETAILED DESCRIPTION

Figure 1:
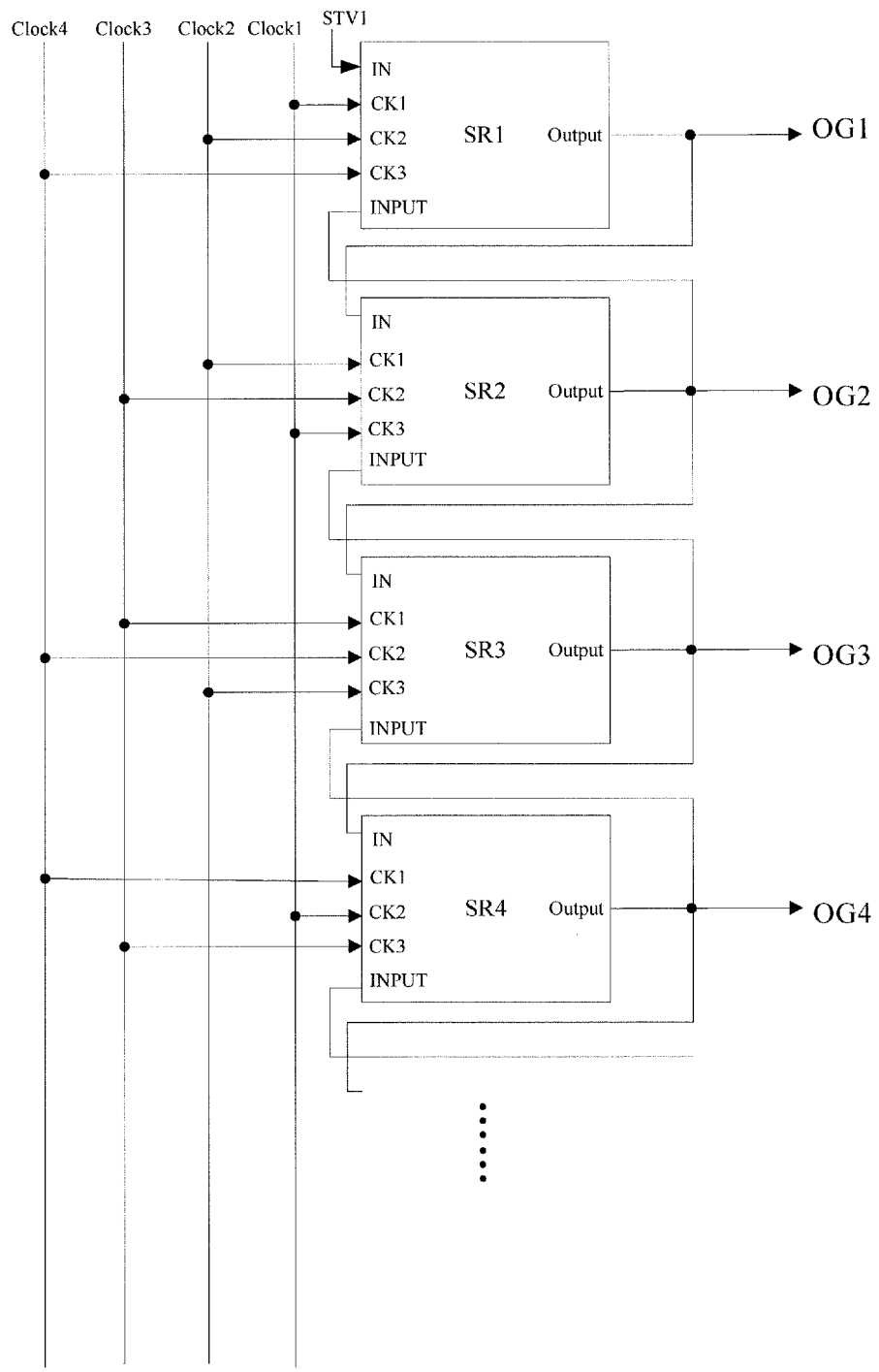
FIG. 1 is a schematic diagram of structure of a GOA circuit provided in an embodiment of the present disclosure.

A GOA unit and a method for driving the same, a GOA circuit and a display apparatus provided in embodiments of the present disclosure will be described below in detail, taken in conjunction with the accompanying drawings of the embodiments of the present disclosure. Same reference signs represent same elements in the present description throughout the accompanying drawings. In the following descriptions, a large amount of details are given for explanations, so as to provide comprehensive understanding to one or more embodiments of the present disclosure. However, it is obvious that the embodiments can be implemented without these details. In other examples, well-known structures and devices are shown in form of block diagram, so as to describe said one or more embodiments.

Each of the switching transistors and the driving transistors adopted in all of the embodiments of the present disclosure can be a thin film transistor, a field effect transistor or another device having same characteristics. A source and a drain of the switching transistor adopted herein are symmetric, and are thus interchangeable. In the embodiments of the present disclosure, in order to distinct two electrodes of a transistor other than a gate, one is referred to as a source and the other is referred to as a drain. According to appearance of a switching transistor in the accompanying drawings, a middle terminal of the switching transistor is a gate, a signal input terminal of the switching transistor is a drain, and an output terminal of the switching transistor is a source. In addition, the switching transistors as adopted in the embodiments of the present disclosure may comprise P-type switching transistors and N-type switching transistors. The P-type switching transistor is turned on when its gate is at a low level, and is turned off when its gate is at a high level; the N-type switching transistor is turned on when its gate is a high level and is turned off when its gate is at a low level. The driving transistor may comprise a P-type driving transistor and a N-type driving transistor. The P-type driving transistor is in a amplification state or a saturation state when its gate voltage is at a low level (the gate voltage is lower than a source voltage) and an absolute value of a voltage difference between its gate and source is higher than its threshold voltage; the N-type driving transistor is in a amplification state or a saturation state when its gate voltage is at a high level (the gate voltage is higher than the source voltage) and an absolute value of a voltage difference between its gate and source is higher than its threshold voltage.

Particularly, in an embodiment of the present disclosure, there is provided a GOA circuit comprising at least three stages of GOA units connected in cascade.

Except a first stage of GOA unit and a last stage of GOA unit, an output terminal of each stage of GOA unit is connected to a second input terminal of its previous stage of GOA unit and a first input terminal of its next stage of GOA unit. An output terminal of the first stage of GOA unit is connected to a first input terminal of its next stage of GOA unit, and an output terminal of the last stage of GOA unit is connected to a second input terminal of its previous stage of GOA unit. A frame start signal is input to a first input terminal of the first stage of GOA unit, or is input to a first input terminal of the last stage of GOA unit.

As shown in FIG. 1, the GOA circuit comprises a plurality of stages of GOA units connected in cascade. An output terminal OUTPUT of a GOA unit SR1 is connected to a gate line OG1 and a first input terminal IN of a GOA unit SR2 at the same time. An output terminal OUTPUT of the GOA unit SR2 is connected to a gate line OG2, a second input terminal INPUT of its previous stage of GOA unit SR1 and a first input terminal IN of its next stage of GOA unit SR3 at the same time. Other GOA units are connected in the same manner.

Each of the GOA units has a first clock signal terminal CK1, a second clock signal terminal CK2, a third clock signal terminal CK3 and four level input terminals comprising a first level terminal CN, a second level terminal CNB, a third level terminal VGH and a fourth level terminal VGL. With reference to FIG. 1, clock signals among four system clock signals Clock1-4 are provided to the three clock signal terminals CK1-3 of each of the GOA units. The first clock signal Clock1 is input to CK1 of SR1, the second clock signal Clock2 is input to CK2 of SR1, and the fourth clock signal Clock4 is input to CK3 of SR1. The second clock signal Clock2 is input to CK1 of SR2, the third clock signal Clock3 is input to CK2 of SR2, and the first clock signal Clock1 is input to CK3 of SR2. The third clock signal Clock3 is input to CK1 of SR3, the fourth clock signal Clock4 is input to CK2 of SR3, and the second clock signal Clock2 is input to CK3 of SR3. The fourth clock signal Clock4 is input to CK1 of SR4, the first clock signal Clock1 is input to CK2 of SR4, and the third clock signal Clock3 is input to CK3 of SR4. Such connection relationship is repeated in every four consecutive GOA units, details omitted.

Figure 2:
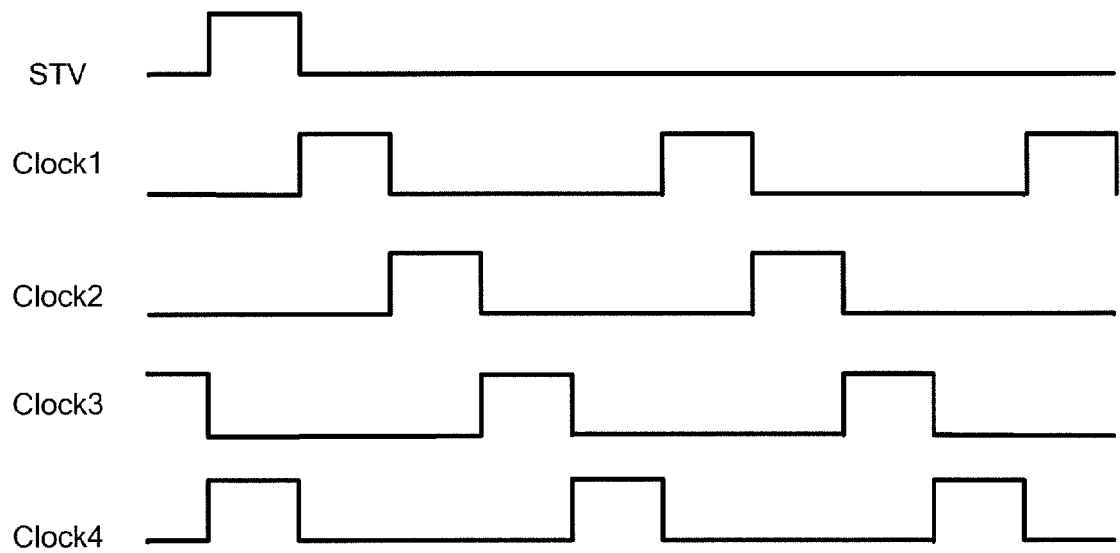
FIG. 2 is a schematic diagram of timing sequence states of system clock signal of the GOA circuit shown in FIG. 1 provided in the embodiment of the present disclosure.

Timing sequence states of the system clock signals are shown in FIG. 2. Clock1-4 have a same clock cycle, Clock2 lays behind Clock1 by ¼ clock cycle, Clock3 lags behind Clock2 by ¼ clock cycle, Clock4 lags behind Clock3 by ¼ clock cycle, and Clock1 lags behind Clock4 by ¼ clock cycle. Particularly, Clock1-4 are clock signals having a duty ratio of 25%, and each cycle of Clock1-4 comprises a single pulse. A rising edge of a pulse of Clock1 advances a rising edge of a pulse of Clock2 by the width of the single pulse, the rising edge of a pulse of Clock2 advances a rising edge of a pulse of Clock3 by the width of the single pulse, and the rising edge of a pulse of Clock3 advances a rising edge of a pulse of Clock4 by the width of the single pulse. Explanations are given by taking the case that respective pulses discussed above have a same pulse width as an example.

The GOA circuit provided in the embodiment of the present disclosure can perform bi-directional scanning. For a forward scanning, the first GOA unit is SR1, an exciting pulse signal, optionally for example a frame start signal STV which is a single pulse signal in the time period of a frame, is input to the first input terminal IN of the GOA unit SR1. With reference to FIG. 2, relationship between the single pulse signal STV and the system clock signal are shown, where a rising edge of the single pulse signal STV is synchronous with a rising edge of a first pulse of the system clock signal Clock4. At this time, the second input terminal INPUT of the last stage of GOA unit SRn is idle. For a reverse scanning, an exciting pulse signal is input to the second input terminal INPUT of the last stage of GOA unit SRn. At this time, the first input terminal IN of the GOA unit SR1 is idle.

Figure 3:
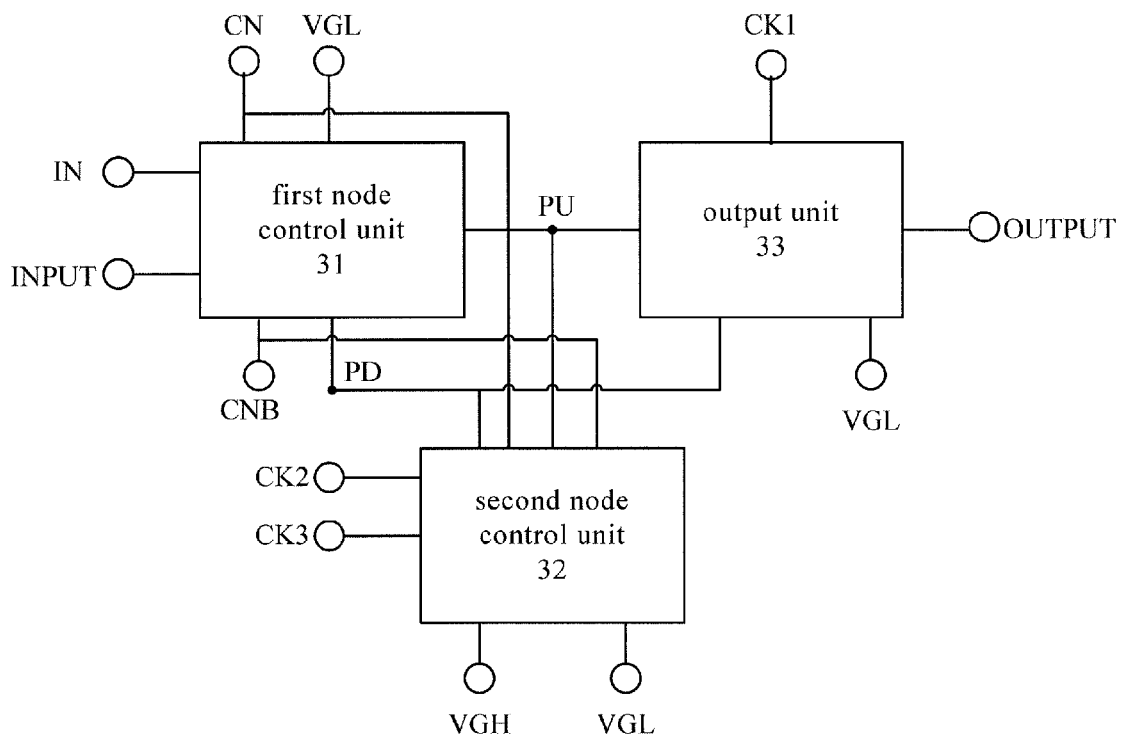
FIG. 3 is a schematic diagram of structure of a GOA unit provided in an embodiment of the present disclosure.

Furthermore, in an embodiment of the present disclosure, there is provided a GOA unit adopted in the above GOA circuit. With reference to FIG. 3, the GOA unit provided in the embodiment of the present disclosure comprises a first node control unit 31, a second node control unit 32 and an output unit 33.

The first node control unit 31 is connected to a first input terminal IN, a second input terminal INPUT, a first level terminal CN, a second level terminal CNB, a first node PU, a second node PD and a fourth level terminal VGL, and is configured to pull a voltage at the first node PU to a voltage at the first level terminal CN under the control of a signal at the first input terminal IN, or pull the voltage at the first node PU to a voltage at the second level terminal CNB under the control of a signal at the second input terminal INPUT. In addition, the first node control unit can be further configured to pull the voltage at the first node PU to the voltage at the fourth level terminal VGL under the control of the second node PD.

The second node control unit 32 is connected to the first level terminal CN, the second level terminal CNB, a third level terminal VGH, the fourth level terminal VGL, a second clock signal terminal CK2, a third clock signal terminal CK3, the first node PU and the second node PD, and is configured to pull a voltage at the second node PD to a voltage at the third level terminal VGH under the control of the first level terminal CN, the second level terminal CNB, the second clock signal terminal CK2 and the third clock signal terminal CK3, or pull the voltage at the second node PD to a voltage at the fourth level terminal VGL under the control of the first node PU.

The output unit 33 is connected to an output terminal OUTPUT, a first clock signal terminal CK1, the first node PU, the second node PD and the fourth level terminal VGL, and is configured to output the signal at the first clock signal terminal CK1 at the output terminal OUTPUT under the control of the first node PU, or pull the voltage at the output terminal OUTPUT to the voltage at the fourth level terminal VGL under the control of the second node PD.

In the above solutions, control on the voltage at the first node PU is implemented by the first node control unit 31, control on the voltage at the second node PD is implemented by the second node control unit 32, and a gate driving signal is outputted at the output terminal OUTPUT of the output unit 33 under the control of the first node PU and the second node PD, so as to reduce the scale of the IC while ensuring the performance of the GOA unit, and thus reduce production cost.

Figure 4:
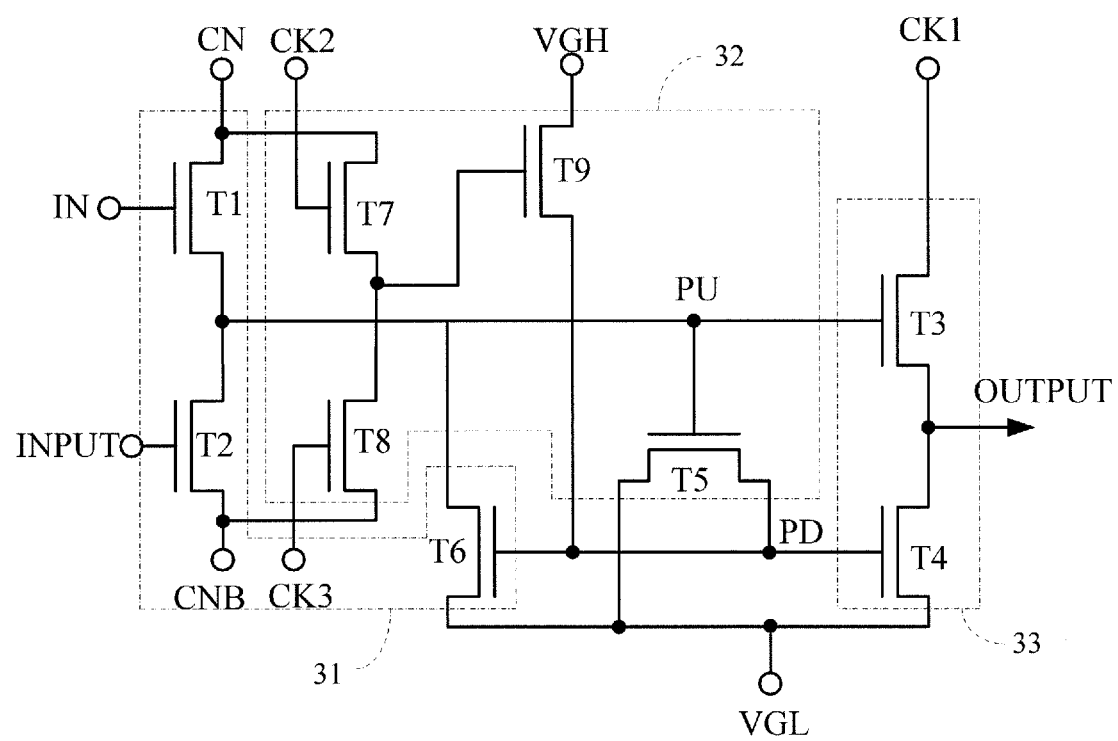
FIG. 4 is a schematic diagram of structure of a GOA unit provided in another embodiment of the present disclosure.

With reference to FIG. 4, connection relationships among internal devices in the GOA unit provided in the embodiment of the present disclosure will be described in detail.

Particularly, the first node control unit 31 comprises a first transistor T1 and a second transistor T2.

The first transistor T1 has a gate connected to the first input terminal IN, a source connected to the first level terminal CN and a drain connected to the first node PU; and is configured to pull the voltage at the first node PU to the voltage at the first level terminal CN under the control of the signal at the first input terminal IN.

The second transistor T2 has a gate connected to the second input terminal INPUT, a source connected to the second level terminal CNB and a drain connected to the first node PU, and is configured to pull the voltage at the first node PU to the voltage at the second level terminal CNB under the control of the signal at the second input terminal INPUT.

In addition, the first node control unit 31 can further comprise a sixth transistor T6. The sixth transistor T6 has a gate connected to the second node PD, a source connected to the first node PU and a drain connected to the fourth level terminal VGL; and is configured to pull the voltage at the first node PU to the voltage at the fourth level terminal VGL under the control of the second node PD.

The output unit 33 comprises a third transistor T3 and a fourth transistor T4.

The third transistor T3 has a gate connected to the first node PU, a source connected to the first clock signal terminal CK1 and a drain connected to the output terminal OUTPUT; and is configured to output the signal at the first clock signal terminal CK1 at the output terminal OUTPUT under the control of the first node PU.

The fourth transistor T4 has a gate connected to the second node PD, a source connected to the output terminal OUTPUT and a drain connected to the fourth level terminal VGL; and is configured to pull the voltage at the output terminal OUTPUT to the voltage at the fourth level terminal VGL under the control of the signal of the second node PD.

Figure 5:
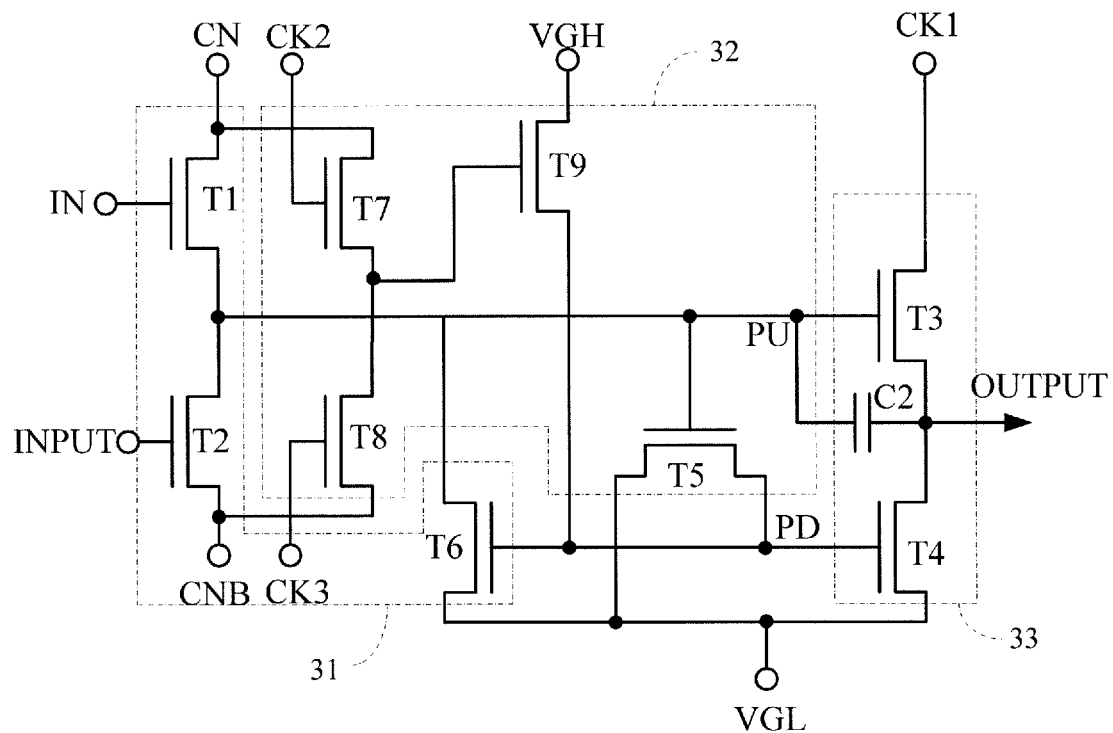
FIG. 5 is a schematic diagram of structure of a GOA unit provided in yet another embodiment of the present disclosure.

Optionally, with reference to FIG. 5, the output unit 33 further comprises a second capacitor C2.

The second capacitor C2 has a first electrode connected to the first node PU and a second electrode connected to the output terminal OUTPUT; and is configured to store the voltage at the first node PU.

With reference to FIG. 4 or FIG. 5, the second node control unit 32 comprises a fifth transistor T5, a seventh transistor T7, an eighth transistor T8 and a ninth transistor T9.

The fifth transistor T5 has a gate connected to the first node PU, a source connected to the second node PD and a drain connected to the fourth level terminal VGL; and is configured to pull the voltage at the second node PD to the fourth level terminal VGL under the control of the signal at the first node PU.

The seventh transistor T7 has a gate connected to the second clock signal terminal CK2, a source connected to the first level terminal CN.

The eighth transistor T8 has a gate connected to the third clock signal terminal CK3, a drain connected to the second level terminal CNB and a source connected to a drain of the seventh transistor T7.

The ninth transistor T9 has a gate connected to the drain of the seventh transistor T7, a source connected to the third level terminal VGH and a drain connected to the second node PD.

The seventh transistor T7 is configured to pull a voltage at the gate of the ninth transistor T9 to the voltage at the first level terminal CN, the eighth transistor T8 is configured to pull the voltage at the gate of the ninth transistor T9 to the voltage at the second level terminal CNB, and the ninth transistor T9 is configured to pull the voltage at the second node PD to the voltage at the third level terminal VGH under the control of the voltage at its gate.

Figure 6:
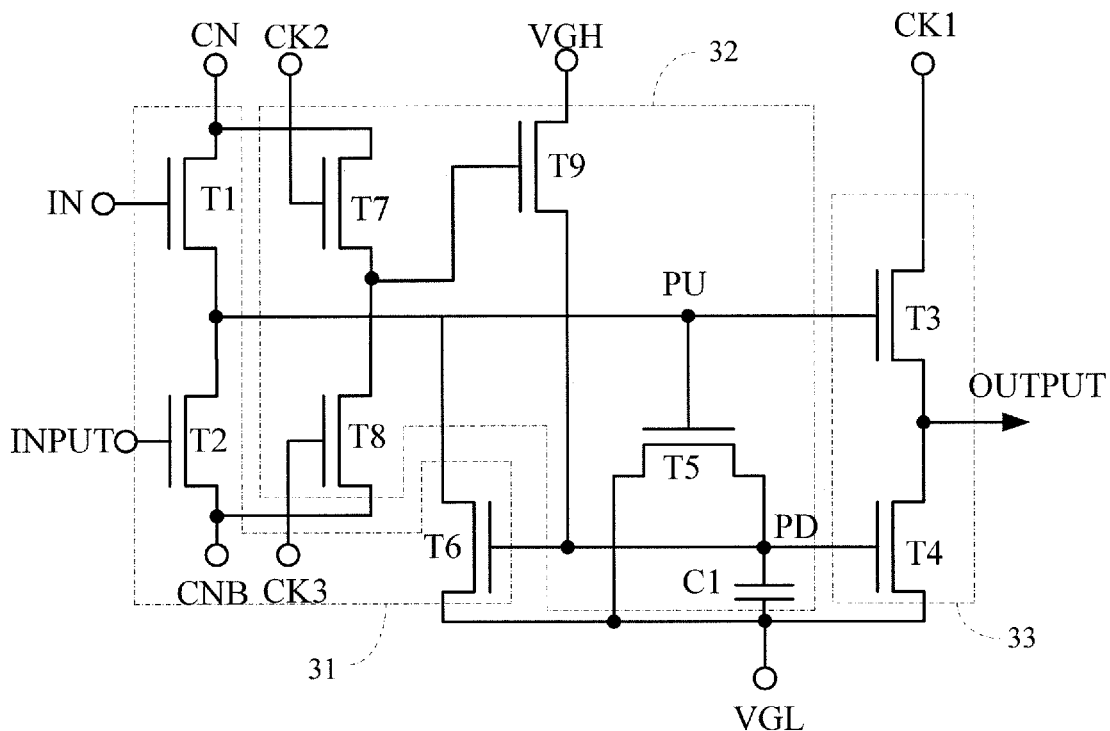
FIG. 6 is a schematic diagram of structure of a GOA unit provided in yet another embodiment of the present disclosure.

Optionally, with reference to FIG. 6, the second node control unit 32 further comprises a first capacitor C1.

The first capacitor C1 has a first electrode connected to the second node PD and a second electrode connected to the fourth level terminal VGL; and is configured to hold the voltage at the second node PD.

Figure 7:
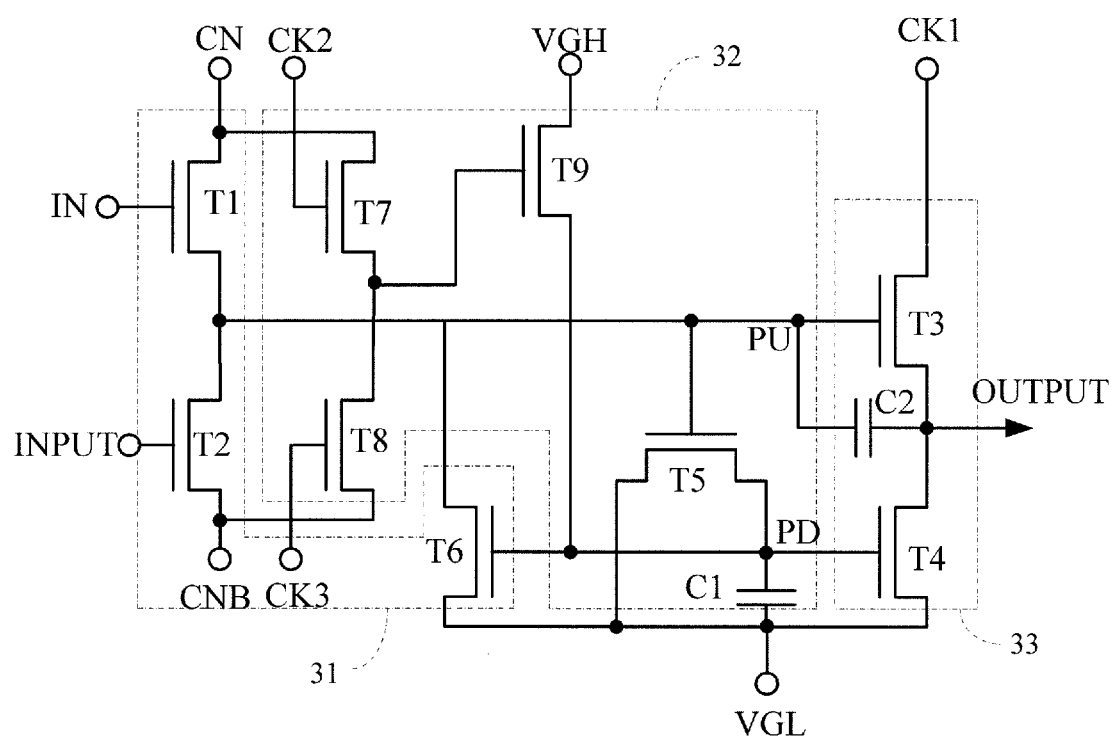
FIG. 7 is a schematic diagram of structure of a GOA unit provided in yet another embodiment of the present disclosure.

Of course, with reference to FIG. 7, the GOA unit can comprise both the first capacitor C1 and the second capacitor C2 simultaneously. In each of the GOA units provided in FIGS. 4-7, nine transistors are comprised, the number of the transistors is significantly reduced and production cost thus is reduced as compared to 12T1C (12 transistors and a capacitor) structure in the prior art.

Figure 8:
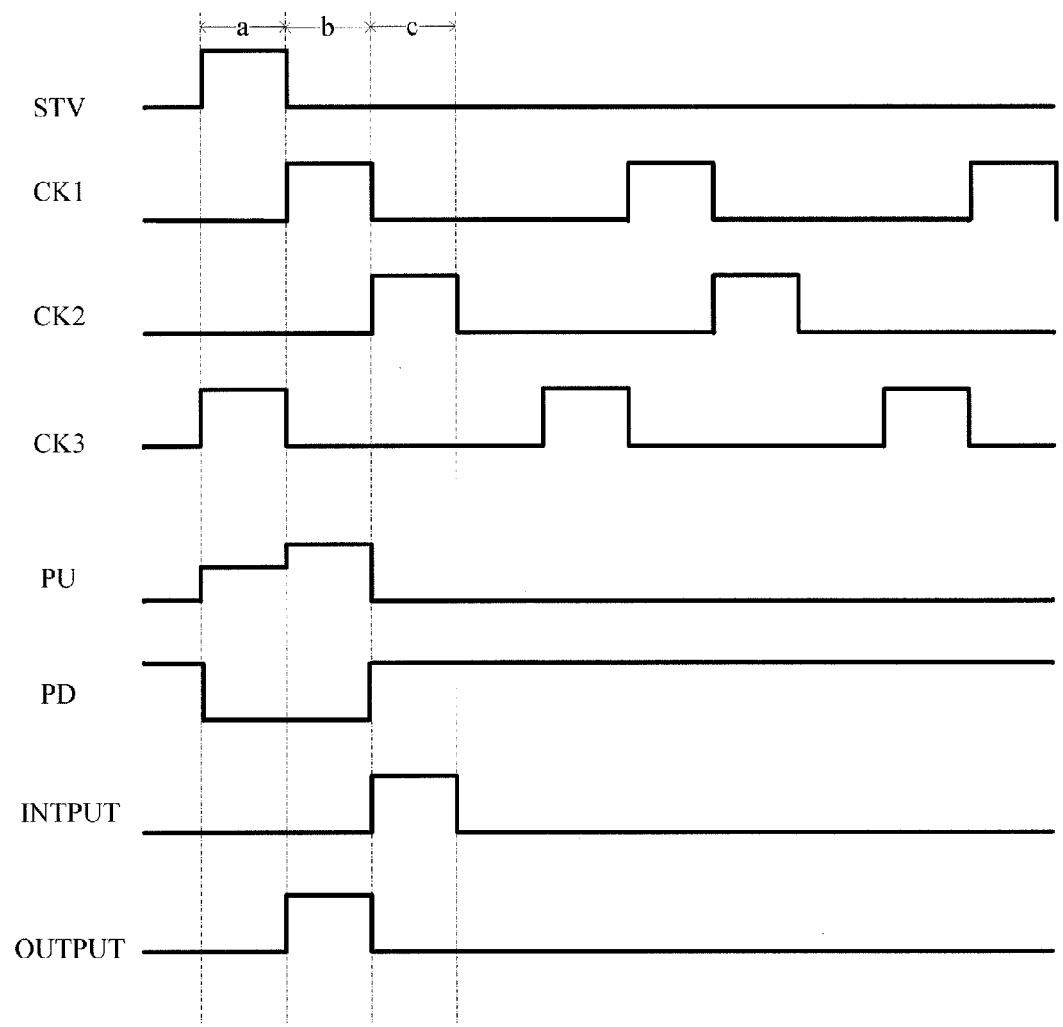
FIG. 8 is a schematic diagram of timing sequence states of driving signals of a GOA unit provided in the embodiment of the present disclosure.
Figure 9:
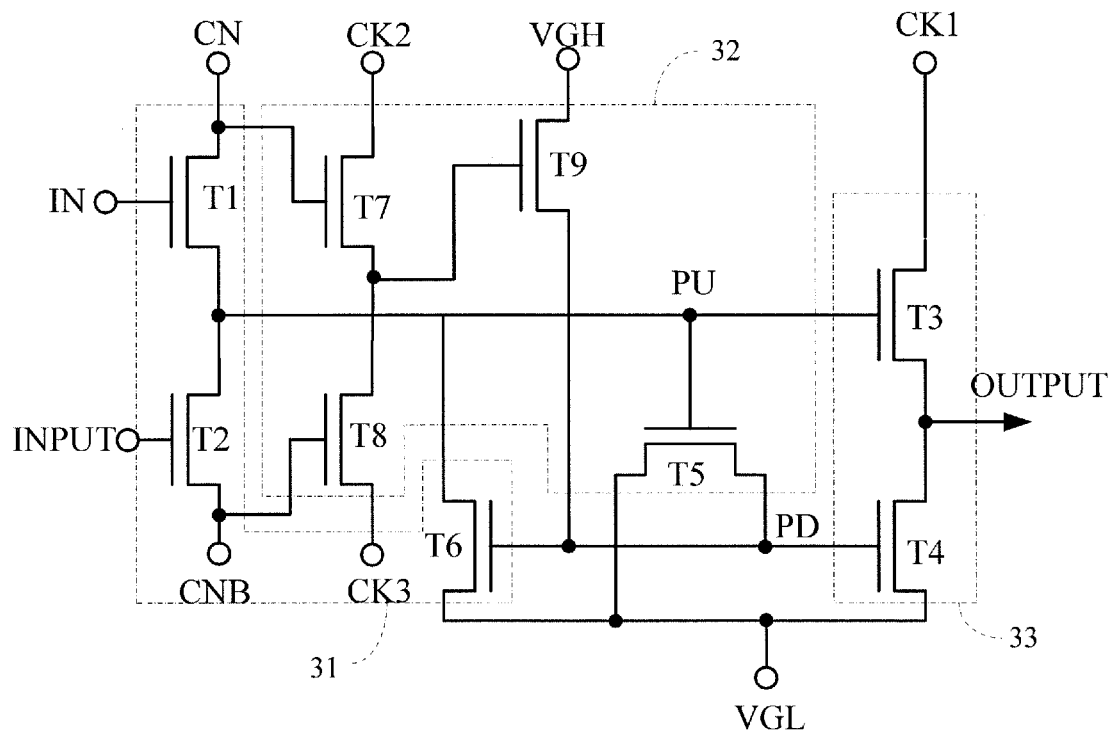
FIG. 9 is a schematic diagram of structure of a GOA unit provided in yet another embodiment of the present disclosure.
Figure 10:
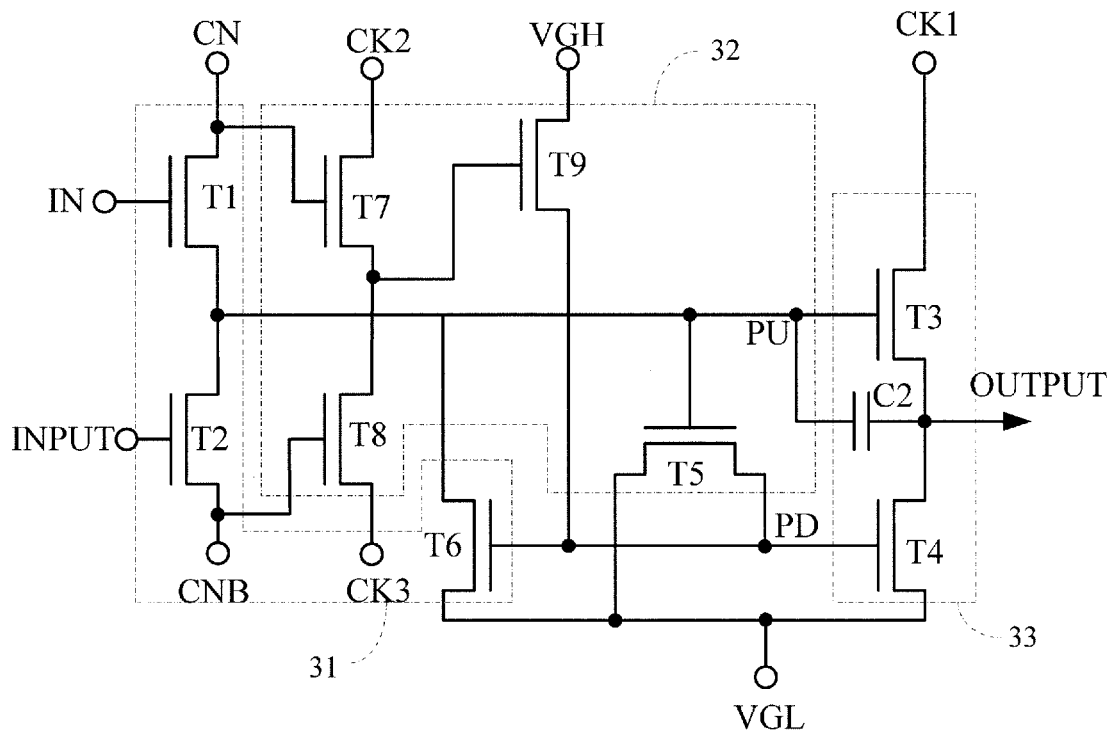
FIG. 10 is a schematic diagram of structure of a GOA unit provided in yet another embodiment of the present disclosure.

With reference to the diagram of the timing sequence states of signals as shown in FIG. 8, the method for driving the GOA unit as shown in FIG. 7 provided by the embodiment of the present disclosure will be described. Clock1 is inputted to CK1, Clock2 is inputted to CK2, Clock4 is inputted to CK3, and explanations will be given by taking the case that each of the transistors is turned on when its gate is at a high level as an example. CN and CNB are signals for controlling forward or reverse scanning, and the GOA unit performs the forward scanning when CN is at a high level and CNB is at a low level and performs the reverse scanning when CN is at a low level and CNB is at a high level. VGL is a low level with a negative polarity, and VGH is a high level with a positive polarity.

Descriptions will be given by taking the forward scanning as an example. FIG. 8 shows the corresponding timing sequences of the signals. During the forward scanning, CN is at a high level and CNB is at a low level.

During a first phase "a", IN is at a high level, Clock1 and Clock2 are at a low level, Clock 4 is at a high level; T1 is turned on, C2 is charged by CN through T1 such that PU changes to a high level, and T5 is turned on to pull the node PD to a low level; T8 is turned on such that T9 is turned off under the control of CNB being at a low level.

During a second phase "b", IN is at a low level, Clock1 is at a high level, Clock2 and Clock4 are at a low level; T1 is turned off and T3 is turned on, the voltage at the node PU is further raised due to the bootstrapping effect of C2, and the output terminal OUTPUT outputs a high level of Clock1; T5 keeps to be turned on at this time such that the node PD keeps at a low level.

During a third phase "c", Clock2 is at a high level, Clock1 and Clock4 are at a low level, T7 is turned on, the gate of T9 is charged by CN through T7 such that T9 is turned on, C1 is charged by VGH through T9 such that PD is pulled up to a high level, T4 and T6 are thus controlled to be turned on simultaneously to discharge C2, T2 is also turned on to discharge C2 since INPUT is at a high level, such that OUTPUT is pulled down to a low level.

The first capacitor C1 functions to hold the high level at PD after OUTPUT outputs. Although a parasitic capacitor of the transistor T5 can also hold the high level at PD in the case that there is not the first capacitor C1 (as shown in FIG. 3), noise at the node PD can be hugely reduced in the case that there is the first capacitor C1. Similarly, in the discussed circuit, the level at the node PU can also be held by a parasitic capacitor of the transistor T3 without the necessary for setting the capacitor C2. The above descriptions are given by taking the forward scanning as an example. For the reverse scanning, the difference only lies in that CN is adjusted to a low level and CNB is adjusted to a high level, the operational principle of the reverse scanning is similar to that of the forward scanning, and repeated descriptions are omitted.

Alternatively and optionally, with reference to FIGS. 9-12, another GOA unit provided in the embodiment of the present disclosure comprises a first node control unit 31, a second node control unit 32 and an output unit 33.

The first node control unit 31 comprises three transistors T1, T2 and T6. For the connection relationships of T1, T2 and T6, please refer to the embodiments corresponding to FIGS. 4-7, and repeated descriptions are omitted herein.

The output unit 33 comprises transistors T3 and T4. For the connection relationships of T3 and T4, please refer to the embodiments corresponding to FIGS. 4-7, and repeated descriptions are omitted herein. Optionally, the output unit 33 can further comprise a second capacitor C2 which is same as that in the embodiments corresponding to FIG. 5 and FIG. 7, repeated descriptions are omitted herein.

The second node control unit 32 comprises a fifth transistor T5, a seventh transistor T7, an eighth transistor T8 and a ninth transistor T9.

The fifth transistor T5 has a gate connected to the first node PU, a source connected to the second node PD and a drain connected to the fourth level terminal VGL; and is configured to pull the voltage at the second node PD to the fourth level terminal VGL under the control of the signal at the first node PU.

The seventh transistor T7 has a gate connected to the first level terminal CN, a source connected to the second clock signal terminal CK2.

The eighth transistor T8 has a gate connected to the second level terminal CNB, a drain connected to the third clock signal terminal CK3 and a source connected to the drain of the seventh transistor T7.

The ninth transistor T9 has a gate connected to the drain of the seventh transistor T7, a source connected to the third level terminal VGH and a drain connected to the second node PD.

The seventh transistor T7 is configured to pull a voltage at the gate of the ninth transistor T9 to the voltage at the second clock signal terminal CK2, the eighth transistor T8 is configured to pull the voltage at the gate of the ninth transistor T9 to the voltage at the third clock signal terminal CK3, and the ninth transistor T9 is configured to pull the voltage at the second node PD to the voltage at the third level terminal VGH under the control of the voltage at its gate.

Figure 11:
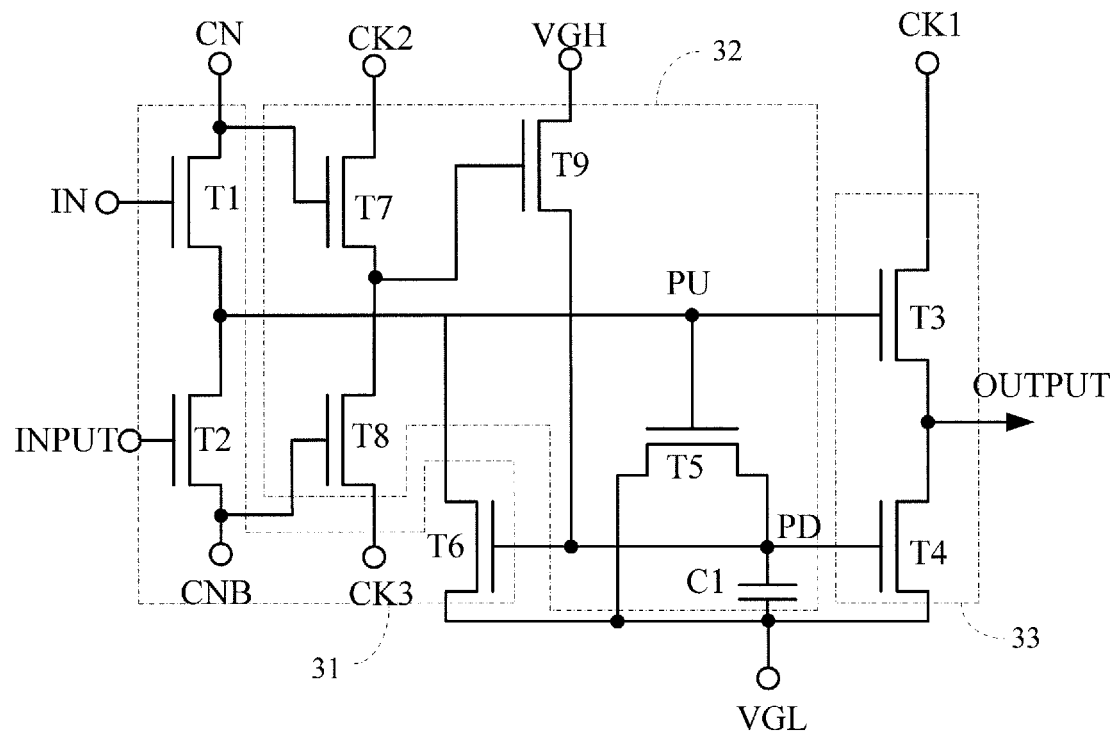
FIG. 11 is a schematic diagram of structure of a GOA unit provided in yet another embodiment of the present disclosure.
Figure 12:
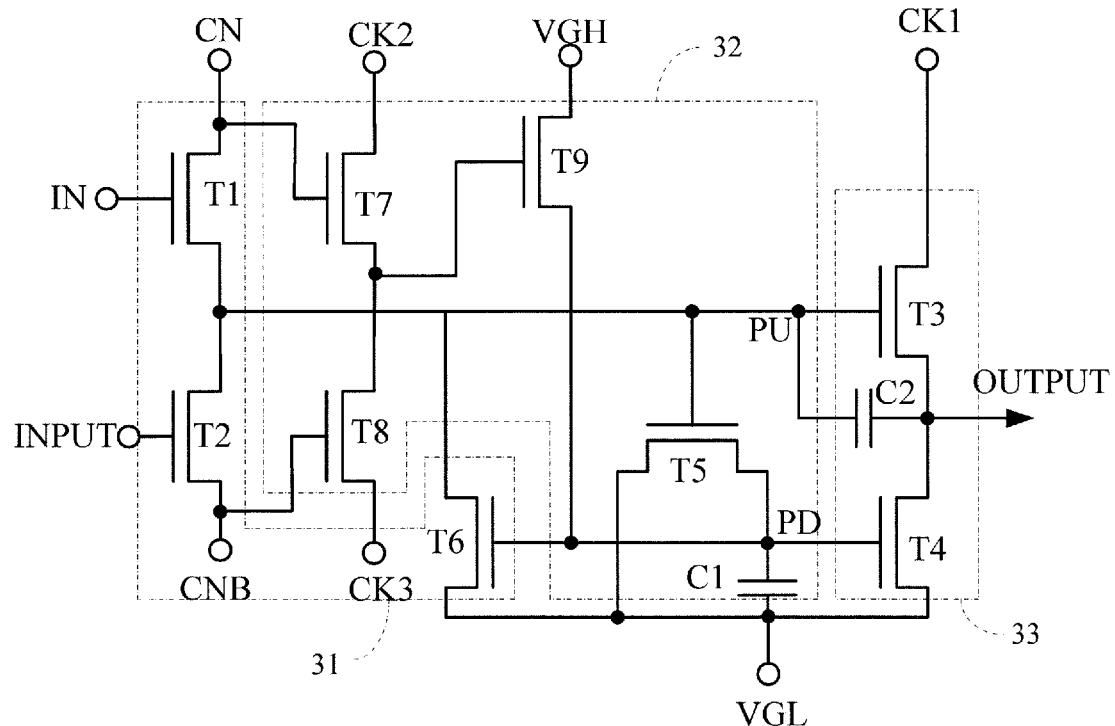
FIG. 12 is a schematic diagram of structure of a GOA unit provided in yet another embodiment of the present disclosure.

Optionally, with reference to FIG. 11 and FIG. 12, the second node control unit 32 further comprises a first capacitor C1. The first capacitor C1 has a first electrode connected to the second node PD and a second electrode connected to the fourth level terminal VGL, and is configured to hold the voltage at the second node PD.

Of course, with reference to FIG. 12, the GOA unit can comprise both the first capacitor C1 and the second capacitor C2 simultaneously. In each of the GOA units provided in FIGS. 9-12, nine transistors are comprised, the number of the transistors is significantly reduced and production cost thus is reduced as compared to 12T1C (12 transistors and a capacitor) structure in the prior art.

With reference to the diagram of the timing sequence states of signals as shown in FIG. 8, the method for driving the GOA unit as shown in FIG. 12 provided by the embodiment of the present disclosure will be described. Clock1 is inputted to CK1, Clock2 is inputted to CK2, Clock4 is inputted to CK3, and explanations will be given by taking the case that each of the transistors is turned on when its gate is at a high level as an example. CN and CNB are signals for controlling forward or reverse scanning, and the GOA unit performs the forward scanning when CN is at a high level and CNB is at a low level and performs the reverse scanning when CN is at a low level and CNB is at a high level. VGL is a low level with a negative polarity, and VGH is a high level with a positive polarity.

Descriptions will be given by taking the forward scanning as an example. FIG. 8 shows the corresponding timing sequences of the signals. During the forward scanning, CN is at a high level and CNB is at a low level.

During a first phase "a", IN is at a high level, Clock1 and Clock2 are at a low level, Clock 4 is at a high level; T1 is turned on, C2 is charged by CN through T1 such that PU changes to a high level, and T5 is turned on to pull the node PD to a low level; T8 is turned off and T7 is turned on such that T9 is turned off under the control of Clock2 being at a low level.

During a second phase "b", IN is at a low level, Clock1 is at a high level, Clock2 and Clock4 are at a low level; T1 is turned off and T3 is turned on, the voltage at the node PU is further raised due to the bootstrapping effect of C2, and the output terminal OUTPUT outputs a high level of Clock1; T5 keeps to be turned on at this time such that the node PD keeps at a low level; meanwhile T7 is turned on such that T9 is turned off under the control of Clock2 being at a low level.

During a third phase "c", Clock2 is at a high level, Clock1 and Clock4 are at a low level, T7 is turned on, the gate of T9 is charged by Clock2 being at a high level through T7 such that T9 is turned on, C1 is charged by VGH through T9 such that PD is pulled up to a high level, T4 and T6 are thus controlled to be turned on simultaneously to discharge C2, T2 is also turned on to discharge C2 since INPUT is at a high level, such that OUTPUT is pulled down to a low level.

As compared to the GOA unit as shown in FIGS. 4-7, the GOA unit as shown in FIGS. 9-12 has a difference in its operational principle: T7 is at an ON state and T8 is at an OFF state during all of the three phases.

The first capacitor C1 functions to hold the high level at PD after OUTPUT outputs. Although a parasitic capacitor of the transistor T5 can also hold the high level at PD in the case that there is not the first capacitor C1 (as shown in FIG. 3), noise at the node PD can be hugely reduced in the case that there is the first capacitor C1. Similarly, in the discussed circuit, the level at the node PU can also be held by a parasitic capacitor of the transistor T3 without the necessary for setting the capacitor C2. The above descriptions are given by taking the forward scanning as an example. For the reverse scanning, in the GOA unit as shown in FIGS. 9-12, CN is adjusted to a low level and CNB is adjusted to a high level, T8 is at an ON state and T7 is at an OFF state during all of the three phases, the operational principle of other elements in the GOA unit during the reverse scanning is similar to that in the above described embodiments, and repeated descriptions are omitted.

In the embodiments of the present disclosure, no limitation is made to types of the respective switching transistors, and the descriptions have been given by taking the case that each of the transistors is turned on when its gate is at a high level. When the type of a transistor is adjusted, it is necessary to adjust a level signal applied on a signal line corresponding to the transistor accordingly, such that the method for driving the GOA unit provided in the embodiments of the present disclosure can be implemented. Any combination easily conceived of and implemented by those skilled in the art based on the GOA unit and the method for driving the same provided in the embodiments of the present disclosure shall fall into the protection scope of the present disclosure.

Figure 13:
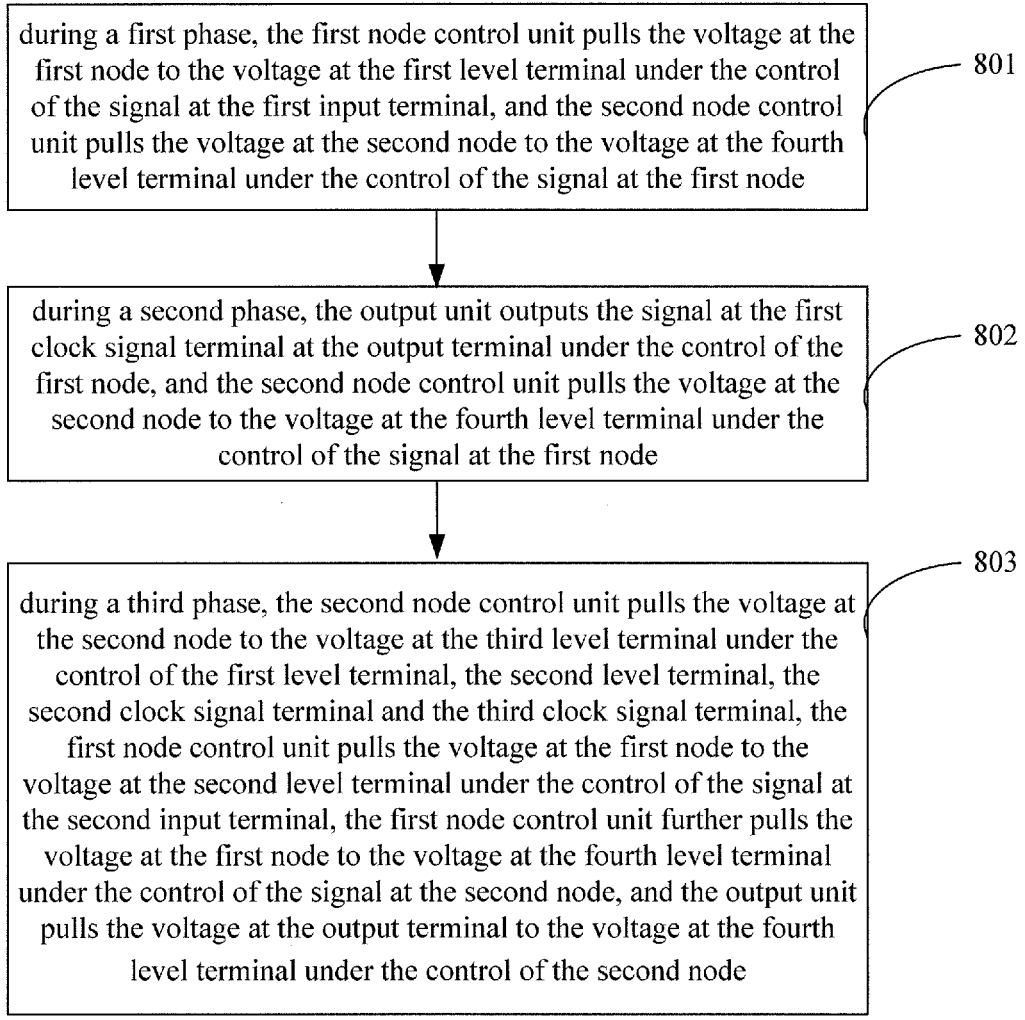
FIG. 13 is a schematic flowchart of a method for driving a GOA unit provided in an embodiment of the present disclosure.

As shown in FIG. 13, in an embodiment of the present disclosure, there is further provided a method for driving the GOA unit described above. The method is applied to the process of forward scanning, and comprises the following steps.

During a first phase 801, the first node control unit 31 pulls the voltage at the first node to the voltage at the first level terminal under the control of the signal at the first input terminal, and the second node control unit 32 pulls the voltage at the second node to the voltage at the fourth level terminal under the control of the signal at the first node.

During a second phase 802, the output unit 33 outputs the signal at the first clock signal terminal at the output terminal under the control of the first node, and the second node control unit 32 pulls the voltage at the second node to the voltage at the fourth level terminal under the control of the signal at the first node.

During a third phase 803, the second node control unit 32 pulls the voltage at the second node to the voltage at the third level terminal under the control of the first level terminal, the second level terminal, the second clock signal terminal and the third clock signal terminal, the first node control unit 31 pulls the voltage at the first node to the voltage at the second level terminal under the control of the signal at the second input terminal, and the output unit 33 pulls the voltage at the output terminal to the voltage at the fourth level terminal under the control of the second node.

In addition, during the third phase 803, the first node control unit 31 further pulls the voltage at the first node to the voltage at the fourth level terminal under the control of the signal at the second node.

In the above solutions, control on the voltage at the first node is implemented by the first node control unit, control on the voltage at the second node is implemented by the second node control unit, and a gate driving signal is outputted at the output terminal of the output unit under the control of the first node and the second node, so as to reduce the scale of the IC while ensuring the performance of the GOA unit, and thus reduce production cost.

Optionally, the first node control unit 31 comprises a first transistor, a second transistor, and a sixth transistor. The detail operations of the method for driving in the respective phases are as follows.

During the first phase 801, the first transistor is in an ON state, the second transistor is in an OFF state, and the sixth transistor is in an OFF state.

During the second phase 802, the first transistor is in an OFF state, the second transistor is in an OFF state, and the sixth transistor is in an OFF state.

During the third phase 803, the first transistor is in an OFF state, the second transistor is in an OFF state, and the sixth transistor is in an ON state.

Optionally, the output unit comprises a third transistor and a fourth transistor. The detail operations of the method for driving in the respective phases are as follows.

During the first phase 801, the third transistor is in an OFF state, and the fourth transistor is in an OFF state.

During the second phase 802, the third transistor is in an ON state, and the fourth transistor is in an OFF state.

During the third phase 803, the third transistor is in an OFF state, and the fourth transistor is in an ON state.

Optionally, the output unit comprises a fifth transistor, a seventh transistor, an eighth transistor and a ninth transistor. The connection relationships of the fifth transistor, the seventh transistor, the eighth transistor and the ninth transistor are same as those in any one of the GOA units in the above described embodiments corresponding to FIGS. 4-7. The detail operations of the method for driving in the respective phases are as follows.

During the first phase 801, the fifth transistor is in an ON state, the seventh transistor is in an OFF state, the eighth transistor is in an ON state, and the ninth transistor is in an OFF state.

During the second phase 802, the fifth transistor is in an ON state, the seventh transistor is in an OFF state, the eighth transistor is in an OFF state, and the ninth transistor is in an OFF state.

During the third phase 803, the fifth transistor is in an OFF state, the seventh transistor is in an ON state, the eighth transistor is in an OFF state, and the ninth transistor is in an ON state.

Optionally, the output unit comprises a fifth transistor, a seventh transistor, an eighth transistor and a ninth transistor. The connection relationships of the fifth transistor, the seventh transistor, the eighth transistor and the ninth transistor are same as those in any one of the GOA units in the above described embodiments corresponding to FIGS. 9-12. The detail operations of the method for driving in the respective phases are as follows.

During the first phase 801, the fifth transistor is in an ON state, the seventh transistor is in an ON state, the eighth transistor is in an OFF state, and the ninth transistor is in an OFF state.

During the second phase 802, the fifth transistor is in an ON state, the seventh transistor is in an ON state, the eighth transistor is in an OFF state, and the ninth transistor is in an OFF state.

During the third phase 803, the fifth transistor is in an OFF state, the seventh transistor is in an ON state, the eighth transistor is in an OFF state, and the ninth transistor is in an ON state.

Figure 14:
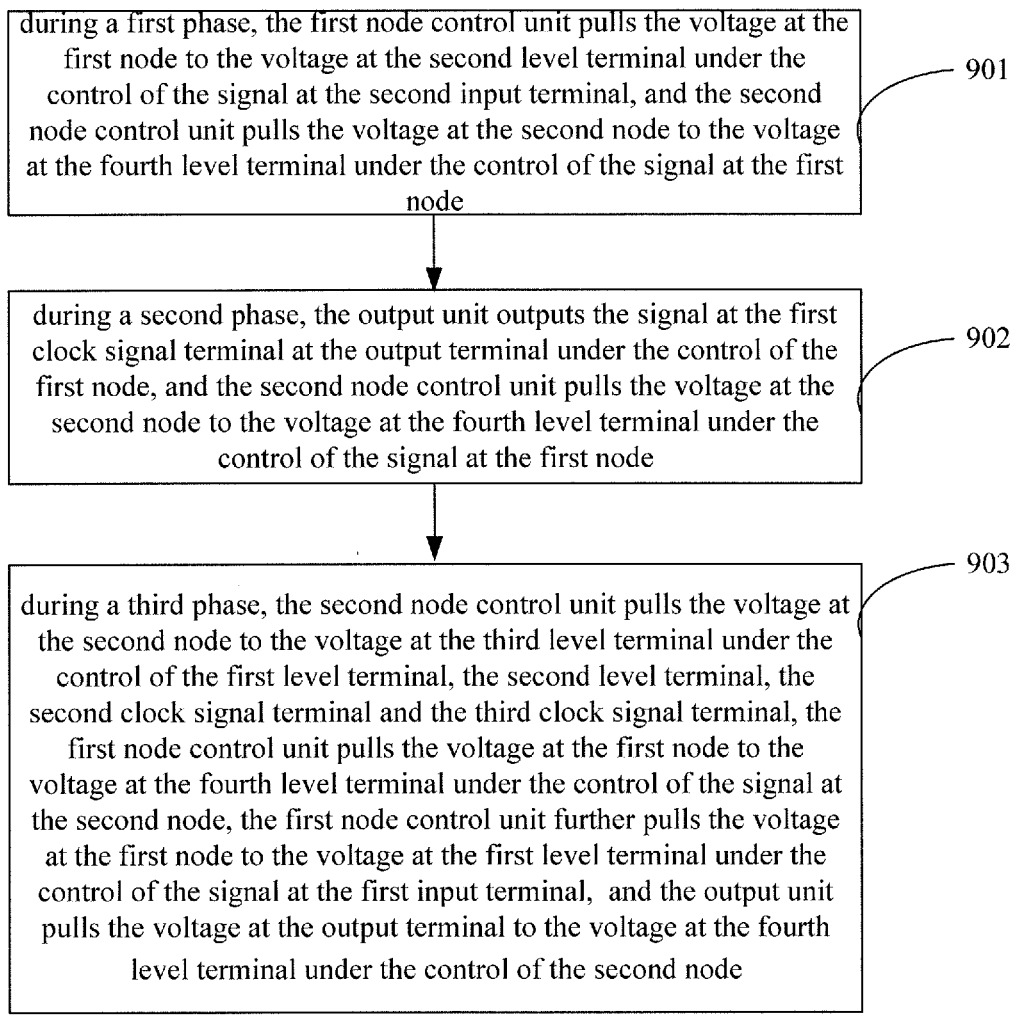
FIG. 14 is a schematic flowchart of a method for driving a GOA unit provided in another embodiment of the present disclosure.

As shown in FIG. 14, in an embodiment of the present disclosure, there is further provided a method for driving the GOA unit described above. The method is applied to the process of reverse scanning, and comprises the following steps.

During a first phase 901, the first node control unit 31 pulls the voltage at the first node to the voltage at the second level terminal under the control of the signal at the second input terminal, and the second node control unit 32 pulls the voltage at the second node to the voltage at the fourth level terminal under the control of the signal at the first node.

During a second phase 902, the output unit 33 outputs the signal at the first clock signal terminal at the output terminal under the control of the first node, and the second node control unit 32 pulls the voltage at the second node to the voltage at the fourth level terminal under the control of the signal at the first node.

During a third phase 903, the second node control unit 32 pulls the voltage at the second node to the voltage at the third level terminal under the control of the first level terminal, the second level terminal, the second clock signal terminal and the third clock signal terminal, the first node control unit 31 pulls the voltage at the first node to the voltage at the fourth level terminal under the control of the signal at the second node, the first node control unit 31 further pulls the voltage at the first node to the voltage at the first level terminal under the control of the signal at the first input terminal, and the output unit 33 pulls the voltage at the output terminal to the voltage at the fourth level terminal under the control of the second node.

In the above solutions, control on the voltage at the first node is implemented by the first node control unit, control on the voltage at the second node is implemented by the second node control unit, and a gate driving signal is outputted at the output terminal of the output unit under the control of the first node and the second node, so as to reduce the scale of the IC while ensuring the performance of the GOA unit, and thus reduce production cost.

Optionally, the first node control unit comprises a first transistor, a second transistor, and a sixth transistor. The detail operations of the method for driving in the respective phases are as follows.

During the first phase 901, the first transistor is in an OFF state, the second transistor is in an ON state, and the sixth transistor is in an OFF state.

During the second phase 902, the first transistor is in an OFF state, the second transistor is in an OFF state, and the sixth transistor is in an OFF state.

During the third phase 903, the first transistor is in an ON state, the second transistor is in an OFF state, and the sixth transistor is in an ON state.

Optionally, the output unit comprises a third transistor and a fourth transistor. The detail operations of the method for driving in the respective phases are as follows.

During the first phase 901, the third transistor is in an OFF state, and the fourth transistor is in an OFF state.

During the second phase 902, the third transistor is in an ON state, and the fourth transistor is in an OFF state.

During the third phase 903, the third transistor is in an OFF state, and the fourth transistor is in an ON state.

Optionally, the output unit comprises a fifth transistor, a seventh transistor, an eighth transistor and a ninth transistor. The connection relationships of the fifth transistor, the seventh transistor, the eighth transistor and the ninth transistor are same as those in any one of the GOA units in the above described embodiments corresponding to FIGS. 4-7. The detail operations of the method for driving in the respective phases are as follows.

During the first phase 901, the fifth transistor is in an ON state, the seventh transistor is in an OFF state, the eighth transistor is in an ON state, and the ninth transistor is in an OFF state.

During the second phase 902, the fifth transistor is in an ON state, the seventh transistor is in an OFF state, the eighth transistor is in an OFF state, and the ninth transistor is in an OFF state.

During the third phase 903, the fifth transistor is in an OFF state, the seventh transistor is in an ON state, the eighth transistor is in an OFF state, and the ninth transistor is in an ON state.

Optionally, the output unit comprises a fifth transistor, a seventh transistor, an eighth transistor and a ninth transistor. The connection relationships of the fifth transistor, the seventh transistor, the eighth transistor and the ninth transistor are same as those in any one of the GOA units in the above described embodiments corresponding to FIGS. 9-12. The detail operations of the method for driving in the respective phases are as follows.

During the first phase 901, the fifth transistor is in an ON state, the seventh transistor is in an OFF state, the eighth transistor is in an ON state, and the ninth transistor is in an OFF state.

During the second phase 902, the fifth transistor is in an ON state, the seventh transistor is in an OFF state, the eighth transistor is in an ON state, and the ninth transistor is in an OFF state.

During the third phase 903, the fifth transistor is in an OFF state, the seventh transistor is in an OFF state, the eighth transistor is in an ON state, and the ninth transistor is in an ON state.

In an embodiment of the present disclosure, there is provided a display apparatus comprising a display circuit. The display circuit comprises a pixel array, a first gate driving unit and a second gate driving unit. Each of the first gate driving unit and the second gate driving unit comprises the GOA circuit provided in the embodiments of the present disclosure, the GOA circuit comprises at least three stages of GOA units provided in the embodiments of the present disclosure and connected in cascade. The display apparatus may be a display device such as an electronic paper, a handheld phone, a television, a digital photo frame, and so on.

The above descriptions are only specific exemplary implementations of the present disclosure, and the scope of the present disclosure is not so limited. Any of modifications, variations and equivalences to the above embodiments easily conceived of by those skilled in the art within the technical scope disclosed by the present disclosure should be included within the protection scope of the present disclosure. Therefore, the protection scope of the present disclosure should be defined by the accompanying claims.

This application claims priority to a Chinese Patent Application No. CN 201410602347.3, filed on Oct. 31, 2014, titled as "GATE DRIVE ON ARRAY UNIT AND METHOD FOR DRIVING THE SAME, GATE DRIVE ON ARRAY CIRCUIT AND DISPLAY APPARATUS", in the China's State Intellectual Property Office, the disclosure of which is incorporated by reference herein as a whole.

What is claimed is:

1. A gate drive on array GOA unit, comprising a first node control unit, a second node control unit and an output unit; wherein
   the first node control unit is connected to a first input terminal, a second input terminal, a first level terminal, a second level terminal, a first node, a second node and a fourth level terminal, and is configured to pull a voltage at the first node to a voltage at the first level terminal under the control of a signal at the first input terminal, or pull the voltage at the first node to a voltage at the second level terminal under the control of a signal at the second input terminal;
   the second node control unit is connected to the first level terminal, the second level terminal, a third level terminal, the fourth level terminal, a second clock signal terminal, a third clock signal terminal, the first node and the second node, and is configured to pull a voltage at the second node to a voltage at the third level terminal under the control of the first level terminal, the second level terminal, the second clock signal terminal and the third clock signal terminal, or pull the voltage at the second node to a voltage at the fourth level terminal under the control of the first node;
   the output unit is connected to an output terminal, a first clock signal terminal, the first node, the second node and the fourth level terminal, and is configured to output a signal at the first clock signal terminal to the output terminal as a gate driving signal under the control of the first node, or pull the voltage at the output terminal to the voltage at the fourth level terminal under the control of the second node.

2. The GOA unit of claim 1, wherein the first node control unit comprises:
   a first transistor having a gate connected to the first input terminal, a source connected to the first level terminal and a drain connected to the first node, and configured to pull the voltage at the first node to the voltage at the first level terminal under the control of the signal at the first input terminal; and
   a second transistor having a gate connected to the second input terminal, a source connected to the second level terminal and a drain connected to the first node, and configured to pull the voltage at the first node to the voltage at the second level terminal under the control of the signal at the second input terminal.

3. The GOA unit of claim 2, wherein the first node control unit is further configured to pull the voltage at the first node to the voltage at the fourth level terminal under the control of the second node, and further comprises a sixth transistor having a gate connected to the second node, a source connected to the first node and a drain connected to the fourth level terminal and configured to pull the voltage at the first node to the voltage at the fourth level terminal under the control of the second node.

4. The GOA unit of claim 1, wherein the output unit comprises:
   a third transistor having a gate connected to the first node, a source connected to the first clock signal terminal and a drain connected to the output terminal, and configured to output the signal at the first clock signal terminal to the output terminal as the gate driving signal under the control of the first node;
   a fourth transistor having a gate connected to the second node, a source connected to the output terminal and a drain connected to the fourth level terminal, and configured to pull the voltage at the output terminal to the voltage at the fourth level terminal under the control of the signal of the second node.

5. The GOA unit of claim 4, wherein the output unit further comprises a second capacitor having a first electrode connected to the first node and a second electrode connected to the output terminal, and configured to store the voltage at the first node.

6. The GOA unit of claim 1, wherein the second node control unit comprises:
   a fifth transistor having a gate connected to the first node, a source connected to the second node and a drain connected to the fourth level terminal, and configured to pull the voltage at the second node to the fourth level terminal under the control of the signal at the first node;
   a seventh transistor having a gate connected to the second clock signal terminal, a source connected to the first level terminal;
   an eighth transistor having a gate connected to the third clock signal terminal, a drain connected to the second level terminal and a source connected to a drain of the seventh transistor; and
   a ninth transistor having a gate connected to the drain of the seventh transistor, a source connected to the third level terminal and a drain connected to the second node.

7. The GOA unit of claim 1, wherein the second node control unit comprises:
   a fifth transistor having a gate connected to the first node, a source connected to the second node and a drain connected to the fourth level terminal, and configured to pull the voltage at the second node to the voltage at the fourth level terminal under the control of the signal at the first node;
   a seventh transistor having a gate connected to the first level terminal, a source connected to the second clock signal terminal;
   an eighth transistor having a gate connected to the second level terminal, a drain connected to the third clock signal terminal and a source connected to the drain of the seventh transistor; and
   a ninth transistor having a gate connected to the drain of the seventh transistor, a source connected to the third level terminal and a drain connected to the second node.

8. The GOA unit of claim 6, wherein the second node control unit further comprises a first capacitor having a first electrode connected to the second node and a second electrode connected to the fourth level terminal, and configured to hold the voltage at the second node.

9. A method for driving the GOA unit of claim 1, comprising:

during a first phase, the first node control unit pulls the voltage at the first node to the voltage at the first level terminal under the control of the signal at the first input terminal, and the second node control unit pulls the voltage at the second node to the voltage at the fourth level terminal under the control of the signal at the first node;

during a second phase, the output unit outputs a signal at the first clock signal terminal to the output terminal as a gate driving signal under the control of the first node, and the second node control unit pulls the voltage at the second node to the voltage at the fourth level terminal under the control of the signal at the first node;

during a third phase, the second node control unit pulls the voltage at the second node to the voltage at the third level terminal under the control of the first level terminal, the second level terminal, the second clock signal terminal and the third clock signal terminal, the first node control unit pulls the voltage at the first node to the voltage at the second level terminal under the control of the signal at the second input terminal, and the output unit pulls the voltage at the output terminal to the voltage at the fourth level terminal under the control of the second node.

10. The method for driving the GOA unit of claim 9, wherein during the third phase, the first node control unit further pulls the voltage at the first node to the voltage at the fourth level terminal under the control of the signal at the second node.

11. A method for driving the GOA unit of claim 1, comprising:

during a first phase, the first node control unit pulls the voltage at the first node to the voltage at the second level terminal under the control of the signal at the second input terminal, and the second node control unit pulls the voltage at the second node to the voltage at the fourth level terminal under the control of the signal at the first node;

during a second phase, the output unit outputs a signal at the first clock signal terminal to the output terminal as a gate driving signal under the control of the first node, and the second node control unit pulls the voltage at the second node to the voltage at the fourth level terminal under the control of the signal at the first node;

during a third phase, the second node control unit pulls the voltage at the second node to the voltage at the third level terminal under the control of the first level terminal, the second level terminal, the second clock signal terminal and the third clock signal terminal, the first node control unit pulls the voltage at the first node to the voltage at the first level terminal under the control of the signal at the first input terminal, and the output unit pulls the voltage at the output terminal to the voltage at the fourth level terminal under the control of the second node.

12. The method for driving the GOA unit of claim 11, wherein during the third phase, the first node control unit further pulls the voltage at the first node to the voltage at the fourth level terminal under the control of the signal at the second node.

13. A gate drive on array GOA circuit, comprising at least three stages of GOA units of claim 1 connected in cascade, wherein except a first stage of GOA unit and a last stage of GOA unit, the output terminal of each stage of GOA unit is connected to the second input terminal of its previous stage of GOA unit and the first input terminal of its next stage of GOA unit, the output terminal of the first stage of GOA unit is connected to the first input terminal of its next stage of GOA unit, and the output terminal of the last stage of GOA unit is connected to the second input terminal of its previous stage of GOA unit, a frame start signal is input to the first input terminal of the first stage of GOA unit, or is input to the first input terminal of the last stage of GOA unit.

14. A display apparatus, comprising the GOA unit of claim 13.

15. The GOA unit of claim 7, wherein the second node control unit further comprises a first capacitor having a first electrode connected to the second node and a second electrode connected to the fourth level terminal, and configured to hold the voltage at the second node.

* * * * *